US008967838B1

United States Patent
Miller

(10) Patent No.: US 8,967,838 B1
(45) Date of Patent: Mar. 3, 2015

(54) FLEXIBLE LED SUBSTRATE CAPABLE OF BEING FORMED INTO A CONCAVE LED LIGHT SOURCE, CONCAVE LIGHT SOURCES SO FORMED AND METHODS OF SO FORMING CONCAVE LED LIGHT SOURCES

(75) Inventor: David Christopher Miller, Tampa, FL (US)

(73) Assignee: David Christopher Miller, Tampa, FL (US)

( * ) Notice: Subject to any disclaimer, the term of this patent is extended or adjusted under 35 U.S.C. 154(b) by 1412 days.

(21) Appl. No.: 11/079,403

(22) Filed: Mar. 14, 2005

Related U.S. Application Data

(60) Provisional application No. 60/554,470, filed on Mar. 13, 2004.

(51) Int. Cl.
*F21V 21/108* (2006.01)

(52) U.S. Cl.
USPC .......................... 362/418; 362/239; 362/800

(58) Field of Classification Search
USPC ........... 362/250, 231, 418, 320, 252, 283, 11, 362/220, 236, 239, 555
See application file for complete search history.

(56) References Cited

U.S. PATENT DOCUMENTS

| | | | | |
|---|---|---|---|---|
| 5,309,277 A * | 5/1994 | Deck | | 359/387 |
| 5,920,643 A * | 7/1999 | White et al. | | 382/141 |
| 6,050,702 A * | 4/2000 | Chuang et al. | | 362/249 |
| 6,149,283 A | 11/2000 | Conway et al. | | |
| 6,220,722 B1 | 4/2001 | Begemann | | |
| 6,401,404 B1 * | 6/2002 | Fillipp et al. | | 52/80.1 |
| 6,452,217 B1 | 9/2002 | Wojnarowski et al. | | |
| 6,461,019 B1 * | 10/2002 | Allen | | 362/249 |
| 6,585,395 B2 * | 7/2003 | Luk | | 362/250 |
| 6,641,284 B2 | 11/2003 | Stopa et al. | | |
| 6,659,632 B2 * | 12/2003 | Chen | | 362/545 |
| 6,682,211 B2 | 1/2004 | English et al. | | |
| 6,688,759 B1 * | 2/2004 | Hadjimichael | | 362/405 |
| 6,709,132 B2 * | 3/2004 | Ishibashi | | 362/249 |
| 6,746,885 B2 | 6/2004 | Cao | | |
| 6,848,819 B1 * | 2/2005 | Arndt et al. | | 362/545 |
| 6,918,693 B2 * | 7/2005 | Ota et al. | | 362/574 |
| 7,086,756 B2 * | 8/2006 | Maxik | | 362/249 |
| 7,090,367 B2 * | 8/2006 | Eversley | | 362/35 |
| 7,121,687 B2 * | 10/2006 | Sidwell et al. | | 362/249 |
| 2003/0189831 A1 | 10/2003 | Yoneda | | |
| 2004/0037080 A1 * | 2/2004 | Luk et al. | | 362/252 |
| 2004/0105262 A1 | 6/2004 | Tseng et al. | | |
| 2004/0170017 A1 | 9/2004 | Zhan et al. | | |
| 2004/0206968 A1 | 10/2004 | Toyota et al. | | |
| 2011/0272721 A1 * | 11/2011 | Butterworth | | 257/98 |
| 2012/0051058 A1 * | 3/2012 | Sharma et al. | | 362/294 |

* cited by examiner

*Primary Examiner* — Jong-Suk (James) Lee
*Assistant Examiner* — Leah S Macchiarolo
(74) *Attorney, Agent, or Firm* — Edward C. Kwok; Hogan Lovells US LLP

(57) ABSTRACT

An illumination source is made from number of light emitting diodes (LEDs) which are distributed on a substrate that is formed into a generally concave reflector surface. The substrate may initially be a sheet with a hub-and-spokes form that is subsequently reshaped to define the reflector surface. In some cases a plenum defined between the substrate and a housing is used to allow a coolant to circulate past the substrate.

5 Claims, 6 Drawing Sheets

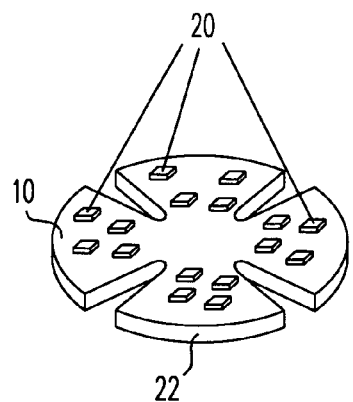
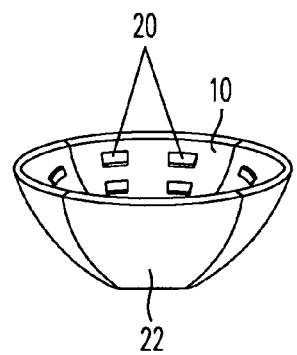
FIG. 6a   FIG. 6b
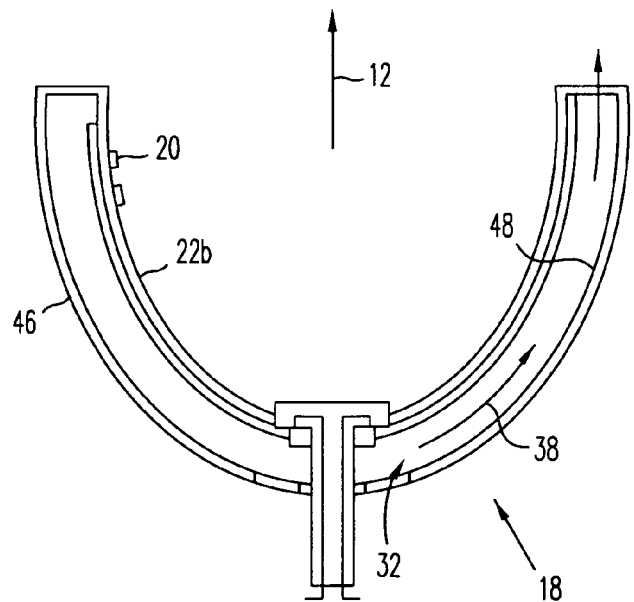
FIG. 11

FLEXIBLE LED SUBSTRATE CAPABLE OF BEING FORMED INTO A CONCAVE LED LIGHT SOURCE, CONCAVE LIGHT SOURCES SO FORMED AND METHODS OF SO FORMING CONCAVE LED LIGHT SOURCES

This application claims the benefit of the inventor's provisional application 60/554,470, having the same title and filed on Mar. 13, 2004

BACKGROUND

The present invention pertains to both a high power lighting product comprising a plurality of light emitting diodes (LEDs) and an arrangement for removing heat from the lamp.

High power LED illumination sources are replacing incandescent bulbs in many applications for reasons including cost savings from longer service life. Many such LED lamps are made from an array of blue-light emitting GaN LEDs combined with a phosphor that converts a fraction of the blue light to yellow light which, when mixed with the blue light, provides an acceptable replacement for a white incandescent source. Both the LED and the phosphor components in such a light source become less efficient when the temperature rises above ninety to one hundred degrees Celsius. In order to remove heat from the active lamp components, some prior art LED lamps have used a chip-on-board (COB) construction approach in which each LED is bonded to a ceramic-coated metal substrate that conducts heat away from the active device.

A filament of an incandescent bulb is very small in comparison to the rest of the bulb and to whatever reflecting or refracting optical elements are used to control the directional output of the light. Thus, an incandescent bulb provides a reasonable approximation of an ideal point source of light, which is desirable if the light from the source is to be focused. When simulating an incandescent source with an LED array, the LEDs are commonly set close together in a planar array that mimics the incandescent filament, but that is necessarily somewhat larger. This relative close packing of the LEDs can lead to overheating even if one uses a substrate with a high thermal conductivity.

In many lighting applications one desires a relatively diffuse source of illumination, such as one finds in ceiling fixtures in which light from a fluorescent or incandescent source is passed through a diffusing screen or globe of some sort.

BRIEF SUMMARY OF THE INVENTION

One aspect of the invention is a plurality of LEDs distributed on a generally concave surface of a reflector portion of an illumination source, where that reflector portion may be generally symmetrical about an axis of illumination output (e.g., as in a flashlight) or may be symmetrical about a line perpendicular to the axis of illumination output (e.g., as one finds in a conventional fluorescent tube fixture). In some embodiments, the concave reflector may be of a prismatic nature in which the LEDs are disposed on ones of a plurality of generally flat sheets or facets that make up the overall concave surface. In other embodiments, the LEDs are directly mounted on ones of a plurality of flat modules that are then assembled with other structural elements to form the lamp having a concave reflector. In preferred embodiments chip-on-board construction approach is used.

In preferred embodiments of the invention a metallic substrate provides a single element that serves as a mounting surface, a heat dissipating element and an optical reflecting surface. The use of chip on board mounting in conjunction with a metallic board allows for adequate thermal dissipation at illumination output levels nearly one hundred times higher than is available with conventional LED illuminators made from pre-packaged LEDs.

In clear contradistinction to conventional optical design approaches that have strong preference for point or line sources, a preferred illuminator of the invention provides a plurality of Lambertian emitters dispersed across a concave reflecting surface. Ray trace analyses of the proposed structures show that an illuminator of this sort can provide illumination that is uniform within plus or minus 5% over sixty degrees of arc. Although most such calculations have been done for parabolic surfaces, similar results are obtained for spherical and hyperbolic reflectors as well. Moreover the design relaxes the traditional requirement for highly specular reflectors and actually works best if the surface has some diffuse reflective component.

In some embodiments of the invention sets of LEDs having different output colors are combined in the array in order to provide a lamp having an adjustable output color. Arrays of this sort may be dispersed about a concave surface of a reflector so as to more effectively combine the different colors in the overall output illumination.

In some embodiments of the invention a reflector having a plurality of LEDs disposed on a front concave surface thereof is combined in an overall illumination structure with plenum-forming elements used to direct a convective flow of air past the back, convex surface of the reflector body so as to provide additional cooling for the lamp.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

BRIEF DESCRIPTION OF THE DRAWING

FIG. 6a is an elevational view depicting LED chips disposed on a flat substrate.

FIG. 6b is an elevational view of the substrate of FIG. 6a after it has been bent to place the LED chips on an internal concave surface.

FIG. 11 is a sectional view through a light assembly showing a cooling channel between the LED substrate and an outer housing.

Figure 1:
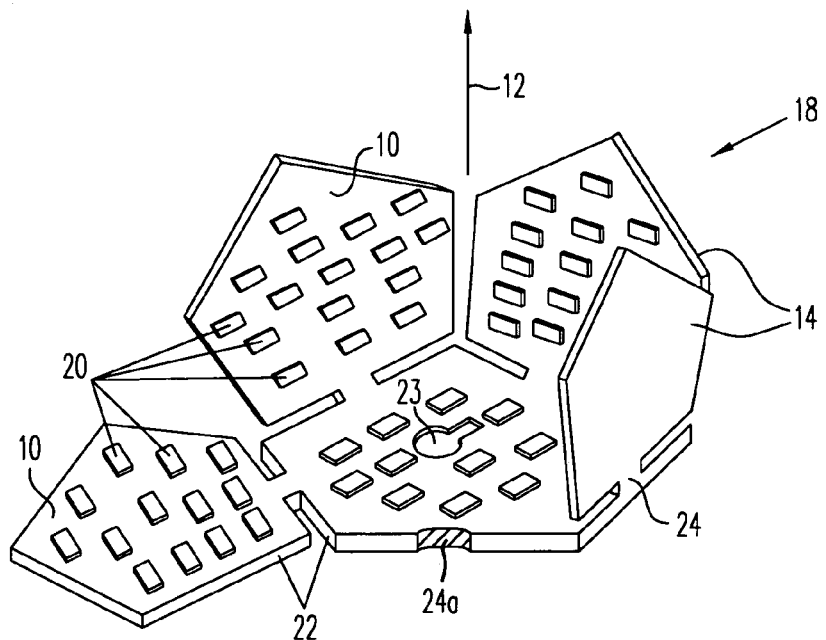
FIG. 1 is a partly cut away elevational view of an LED light source of the invention.

Those skilled in the art will appreciate that in the several views of the drawing depicting LEDs disposed on a substrate, the various conducting traces used to interconnect the LEDs and to provide electrical power from an external source thereof have been omitted in the interest of clarity of presentation.

DETAILED DESCRIPTION

In studying this Detailed Description, the reader may be aided by noting definitions of certain words and phrases used throughout this patent document. Wherever those definitions are provided, those of ordinary skill in the art should understand that in many, if not most instances, such definitions apply to both preceding and following uses of such defined words and phrases. At the outset of this Description, one may note that the terms "include" and "comprise," as well as derivatives thereof, mean inclusion without limitation; the term "or," is inclusive, meaning and/or, and that the term 'flexible' is used to denote a material that can be deformed at least once (e.g., from an initial flat sheet shape into a cuplike configuration) without any implication that the structure so formed is flaccid or incapable of retaining its formed shape.

As noted above, many light sources commonly comprise a point source of illumination and a reflecting surface 10 arranged to project a beam of light along an illumination axis 12. The reflecting surface may be an approximation to a geometric surface of rotation about the axis 12, such as a spherical or another conic section such as a parabolic reflector, or may be a prismatic surface comprising a plurality of planar surfaces 14 having an N-fold symmetry about the axis and approximating a geometric surface of rotation. Other light sources, such as those used with fluorescent tubes, may be extended along a tube axis and may comprise a half-cylinder or a prismatic approximation thereto.

A preferred light source 18 of the invention comprises a plurality of LEDs 20 distributed across a reflector surface 10 to form an extended light source. The areal density of the LED distribution is preferably limited so as to keep the operating temperatures of all of the LEDs below a maximum operating temperature, which is commonly about ninety to one hundred degrees Celsius.

This use of an extended light source, rather than an approximate point source, provides superior heat transfer characteristics at the expense of optical qualities that depend on the source being a point source or a reasonable approximation thereof. For most area lighting applications, diffuse illumination is desired and highly focused light is not. For these applications the light source of the invention provides significant operating advantages. Further, the exit beam from the present invention offers a range similar to a variety of incandescent reflector bulbs, both in size and beam divergence, depending on the specific reflector shape and diode placement.

Turning now to FIG. 1, one finds a portion of a light source comprising a plurality of LEDs 20 distributed across a reflecting surface 10 of a flexible substrate 22, which may be a flexible printed circuit board to which the LED chips 20 are attached in conventional chip-on-board fashion. The substrate 22 is initially formed as a polyfurcated flat sheet that is slit so as to appear to be six pentagons connected by narrow webs 24. During fabrication the sheet is folded through the web regions to bring the outer pentagons toward the illumination axis 12 so as to form a faceted concave reflector. In the interest of clarity of presentation one of the six pentagons has been cut away at the web point 24a in the depiction of FIG. 1. The use of an initially flat sheet permits more or less conventional chip-on-board processing techniques to be used to attach the individual LEDs 20 to the substrate 22 (which may be a conventional steel substrate having a reflective ceramic or porcelain layer covering its reflecting surface 10).

A similar arrangement that results in a cup-like light source made by folding up the petal-like portions of a polyfurcated substrate to define a concave curved surface is shown in FIGS. 6a and 6b.

Figure 2:
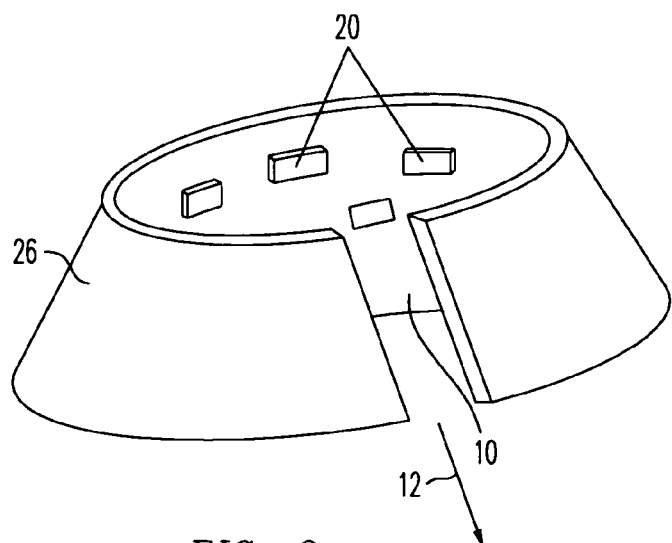
FIG. 2 is an elevational view of another embodiment of an LED light source.

Many other approaches may be adopted to form a LED array on a concave reflector. As another example, one could prepare an array on a flat sheet that is then rolled, bent, or otherwise deformed to define a frusto-conical collar 26, as depicted in FIG. 2. Those skilled in the art will recognize that the configuration depicted in FIG. 2 could also be made by attaching LEDs to a pre-formed collar.

Figure 7:
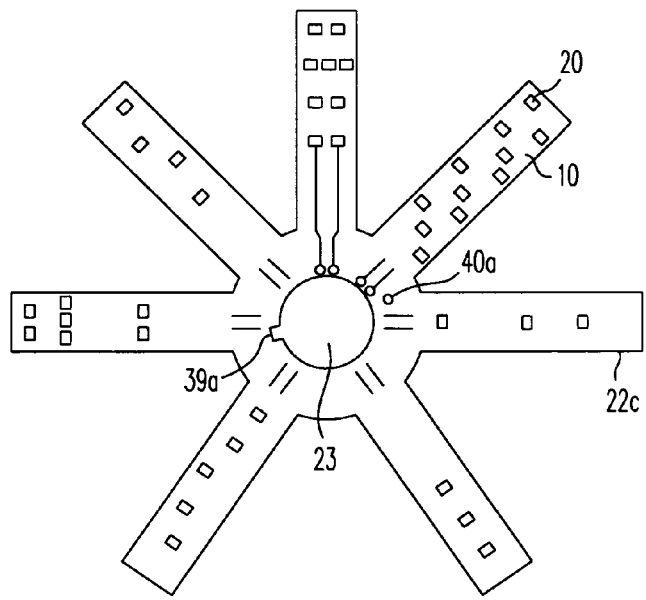
FIG. 7 is an elevational view of a flexible substrate having an array of LEDs mounted thereon.
Figure 8:
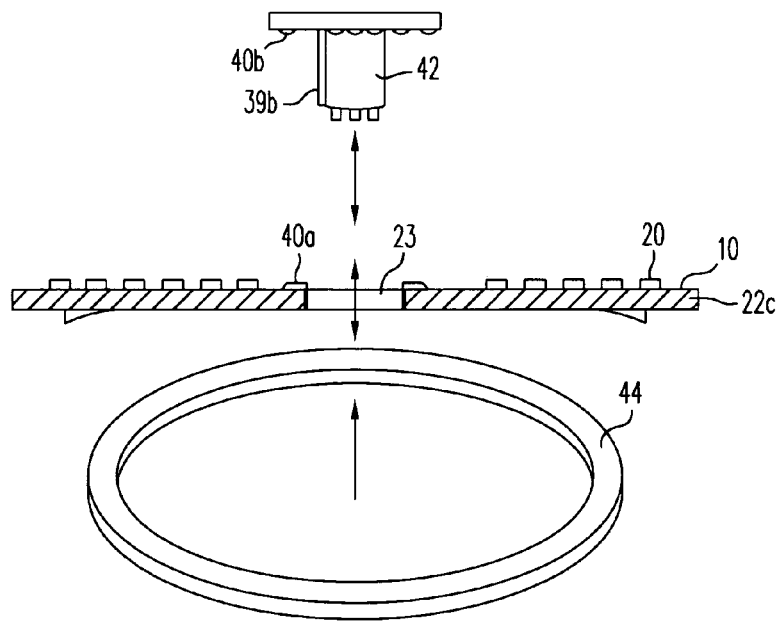
FIG. 8 is an exploded view showing a light assembly comprised of the substrate of FIG. 7, a connector and a ring.
Figure 9:
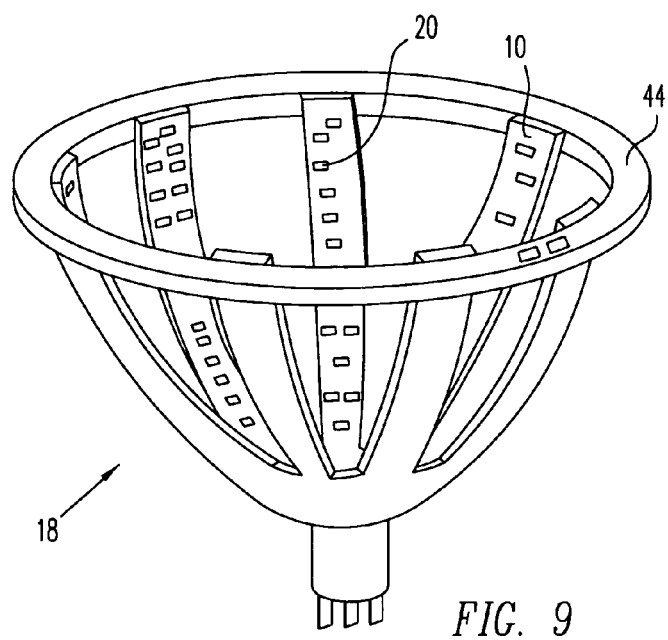
FIG. 9 is an elevational view of the light assembly of FIG. 8.
Figure 10:
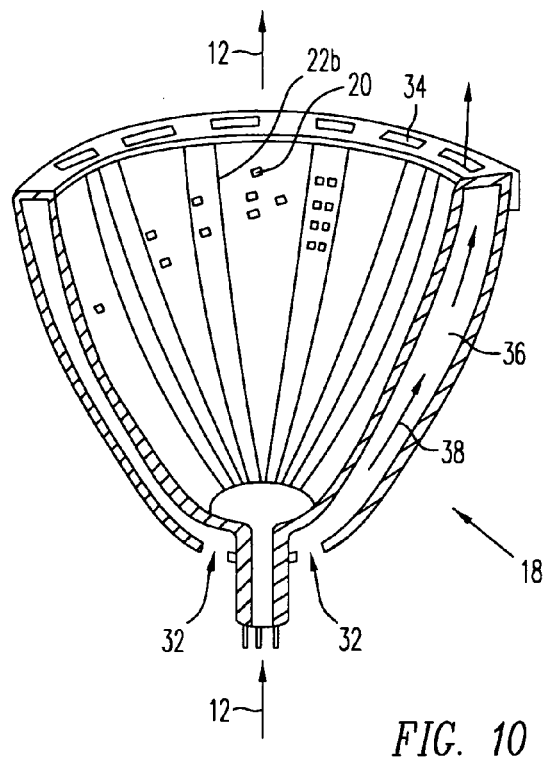
FIG. 10 is a vertical sectional view of a second embodiment of a lighting assembly made in which the substrate is designed to be deformed to completely cover a reflector surface.

As another example, the light assembly may be formed by mounting LED chips 20 on a top surface of a multi-armed flexible substrate 22c having an initial polyfurcated hub-and-spokes configuration comprising a central hub portion and a plurality of arm portions, each of which has a respective free end distal from the hub. This preferred substrate 22c has central throughhole 23, as depicted in FIG. 7. In one such arrangement, the LED light source 18 (FIG. 1) is formed by pushing a connector 42 (FIG. 8) through the throughhole 23 and flexing the substrate 22c by pushing it through a ring 44. In this arrangement an electric contact is made between pads 40a on the array board 22c (FIG. 7) and corresponding pads 40b on the connector plug 42 (FIG. 8). Rotational alignment is assured by the combination of a cutout 39a in the substrate coacting with a tongue 39b on the connector 42. When assembled, this light source has the final shape shown in FIG. 9 in which a reflector surface is symmetrical about an axis of illumination and a plurality of light sources are arrayed upon the reflector. It may be noted that if the arm portions of the substrate 22c are formed appropriately, a light source formed in this manner can have a continuous internal reflecting surface, as depicted in the sectional view of FIG. 10. It will also be recognized that the ring 44 is not an essential element of the light source, which can employ a different sort of retaining means for holding the free ends of the arms in a desired configuration. For example, the initially flat substrate 22c can be deformed into an appropriate shape and then retained by a reflector housing 46 into which it is inserted. In a preferred embodiment, the reflector housing 46 (see FIG. 11) may have an internal reflective surface 48 to provide both an enhanced reflectivity for the overall illuminator 18 (see FIG. 11) and a plenum 36 (see FIG. 10) or cooling channel though which suitable coolant 38 may flow.

Figure 3:
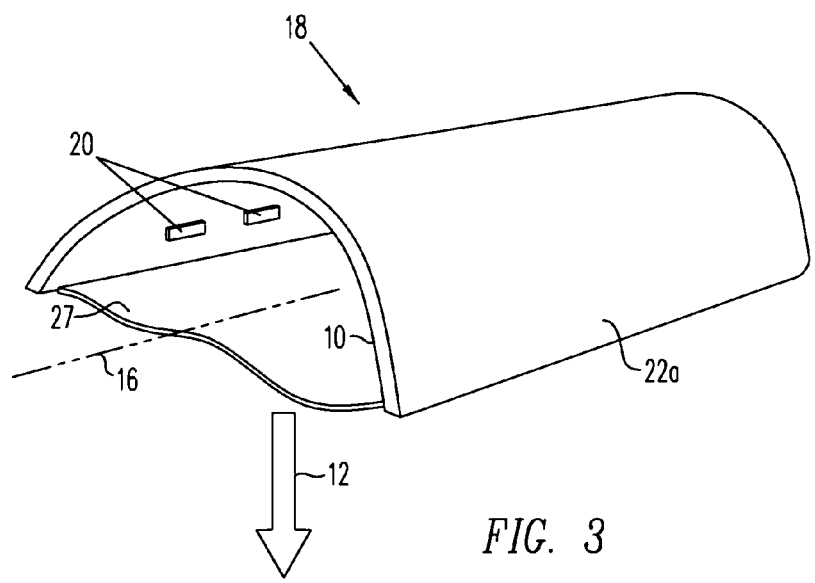
FIG. 3 is an elevational view of an LED light source of the invention having a tubular configuration.
Figure 4:
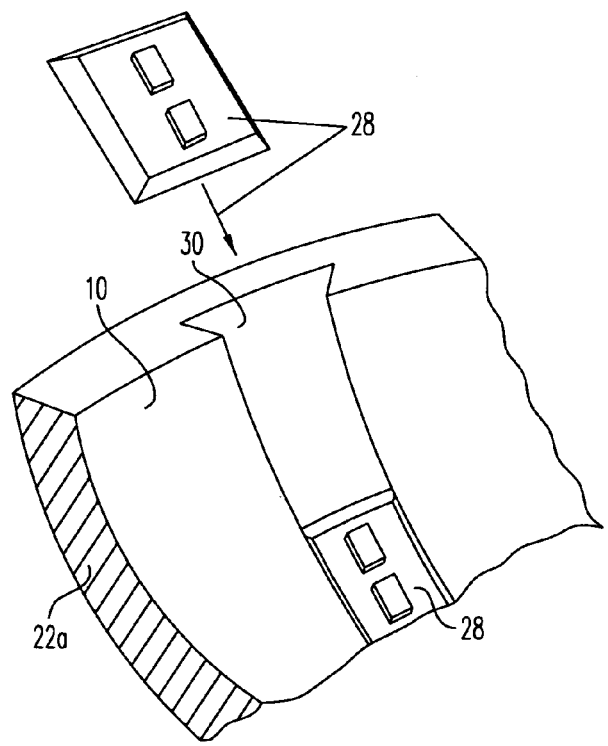
FIG. 4 is an exploded sectional detail view depicting an assembly arrangement for an LED light source of the invention

In addition to embodiments approximating surfaces of rotation formed about an illumination axis, the invention can also provide an elongated light source having some similarities to a conventional fluorescent tube. A plurality of LEDs may be arranged on an internal reflecting surface 10 of a semi-cylindrical substrate 22a, as depicted in FIG. 3. Also shown in this figure is a generally transparent polymeric body 27 which may contain suitable color-conversion phosphors. Such bodies are commonly used with LEDs to provide optical index of refraction matching.

In some embodiments of the invention an LED array is formed by inserting LED modules 28 into channels 30 formed in a substrate 22a comprising the reflective surface 10. The modules could be held in respective selected positions and thermally coupled to the substrate by known means such as a silver-filled epoxy cement. Electrical leads (not shown) could then be attached to each LED by the use of conventional bonding approaches.

Figure 5:
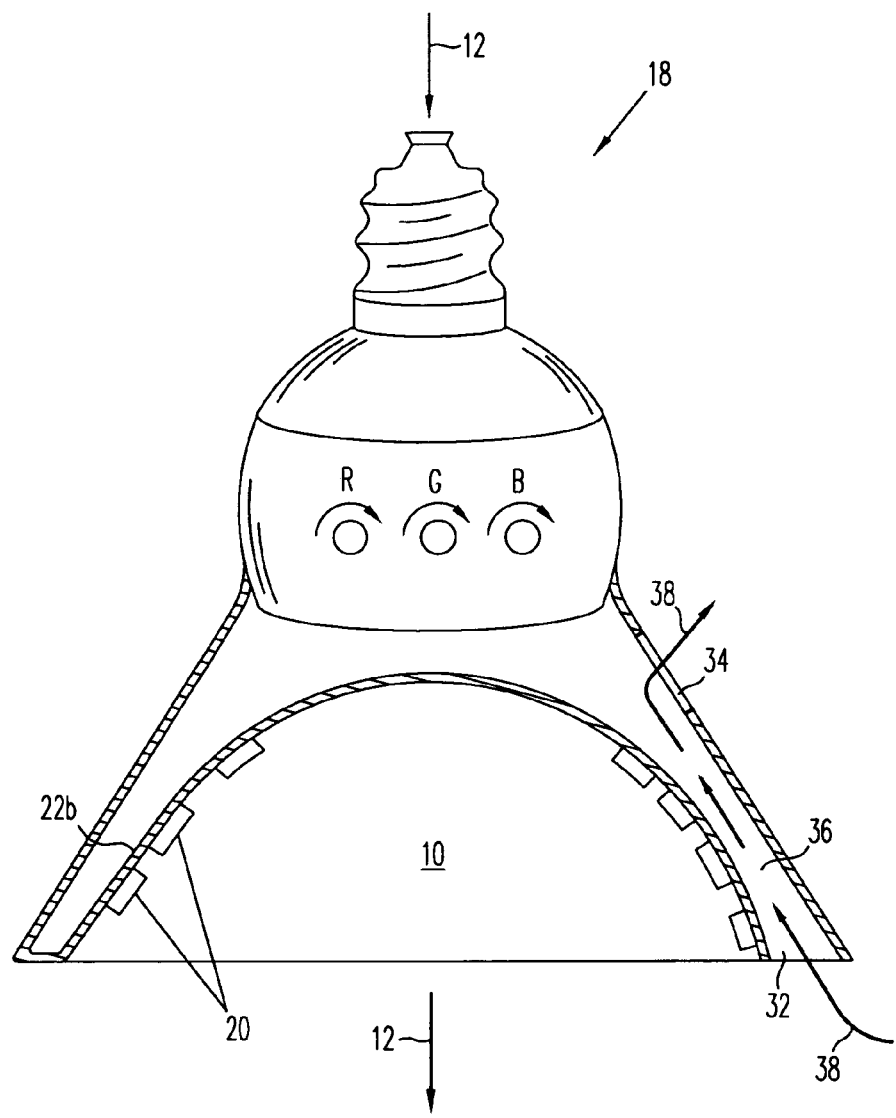
FIG. 5 is a partly cut away view of an LED light source of the invention comprising a convectional cooling plenum

Although spreading the LEDs widely across a reflecting surface is useful for avoiding heat buildup, some embodiments of the invention also provide convective structures for encouraging cooling air to flow over the substrate. Turning now to FIG. 5, one finds a light source 18 having an array of red, green and blue LEDs 20 spread across a concave spherical reflecting surface 10 portion of a formed substrate 22b having air inlet 32 and exhaust 34 holes communicating by means of a plenum 36 defined between the inner and outer portions of the structure. In a structure of this sort cooling air can flow through the plenum, as indicated by the arrows 38 in FIG. 5, so as to remove heat generated by the LEDs to the spherical reflector portion of the substrate 22b.

A preferred embodiment of the invention comprises a plurality of LED chips, mounted in a chip-on-board fashion, on an internal surface of a parabolic reflector. When the chips are fairly uniformly dispersed over the reflector, this produces a highly uniform beam. It should be noted that although LEDs are often packaged with lenses as LED lamps, the preferred embodiment of the invention depends on the use of chips that are not so packaged and that provide the Lambertian emission profile known to be characteristic of LEDs. That is, a specific embodiment of the invention comprises a plurality of light emitting elements disposed uniformly on a parabolic reflector surface where each of the emitting elements is characterized in that the intensity of light emitted from it varies with the cosine of the angle of emission and the surface normal. The combined effect is a beam similar to that of a variety of incandescent reflector lamps.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. An illumination source comprising:
a metallic substrate having an internal concave optical reflecting surface that is symmetrical about a longitudinal axis;
a plurality of light emitting diodes being mounted on the internal concave optical reflecting surface to form an extended light source providing a beam exiting the light source in at least a direction along the longitudinal axis, wherein the light emitting diodes are mounted at no higher than a predetermined areal density, such that heat generated by the light emitting diodes are dissipated through the metallic substrate so as to maintain an operating temperature at the internal optical reflecting surface to be less than 100° C., and wherein each emitting diode is packaged to provide a Lambertian emission profile;
a reflector housing spaced apart from the metallic substrate so as to define a plenum therebetween; and
electrical connections to provide power to the light emitting diodes.

2. The illumination source of claim 1, wherein the metallic substrate is a polyfurcated substrate.

3. The illumination source of claim 1, wherein the internal concave optical reflecting surface has a contour of a conic section.

4. The illumination source of claim 1, wherein the internal concave optical reflecting surface has a contour of a sphere.

5. The illumination source of claim 1, wherein the reflector housing and the metallic substrate are secured relative to each other by a ring.

\* \* \* \* \*